United States Patent [19]

Maserjian

[11] Patent Number: 4,953,955
[45] Date of Patent: Sep. 4, 1990

[54] PHOTOVOLTAIC DRIVEN MULTIPLE QUANTUM WELL OPTICAL MODULATOR

[75] Inventor: Joseph Maserjian, Goleta, Calif.

[73] Assignee: California Institute of Technology, Pasadena, Calif.

[21] Appl. No.: 204,739

[22] Filed: Jun. 10, 1988

Related U.S. Application Data

[60] Continuation-in-part of Ser. No. 149,653, Jan. 28, 1988, Pat. No. 4,818,079, which is a division of Ser. No. 3,633, Jan. 15, 1987, abandoned.

[51] Int. Cl.$^5$ .............................................. G02F 1/01
[52] U.S. Cl. .................................................... 350/354
[58] Field of Search ....................... 350/354, 355, 356; 357/4

[56] References Cited

U.S. PATENT DOCUMENTS

| | | | |
|---|---|---|---|
| 4,528,464 | 7/1985 | Chemla et al. | 372/50 X |
| 4,536,061 | 8/1985 | Nishimura | 350/354 |
| 4,626,075 | 12/1986 | Chemla | 350/386 X |
| 4,761,620 | 8/1988 | Bar-Joseph et al. | 350/384 |

Primary Examiner—Eugene R. LaRoche
Assistant Examiner—Nathan W. McCutcheon
Attorney, Agent, or Firm—David W. Collins

[57] ABSTRACT

Multiple quantum well (MQW) structures (12) are utilized to provide real-time, reliable, high-performance, optically-addressed spatial-light modulators (SLM) (10). The optically-addressed SLM comprises a vertical stack of quantum well layers (12a) within the penetration depth of an optical write signal 18, a plurality of space charge barriers (12b) having predetermined tunneling times by control of doping and thickness. The material comprising the quantum well layers has a lower bandgap than that of the space charge barrier layers. The write signal modulates a read signal (20). The modulation sensitivity of the device is high and no external voltage source is required. In a preferred embodiment, the SLM having interleaved doped semiconductor layers for driving the MQW photovoltaically is characterized by the use of a shift analogous to the Moss-Burnstein shift caused by the filling of two-dimensional states in the multiple quantum wells, thus allowing high modulation sensitivity in very narrow wells. Arrays (30) may be formed with a plurality of the modulators.

18 Claims, 3 Drawing Sheets

PHOTOVOLTAIC DRIVEN MULTIPLE QUANTUM WELL OPTICAL MODULATOR

ORIGIN OF INVENTION

The invention described herein was made in the performance of work under a NASA contract, and is subject to the provisions of Public Law 96-517 (35 U.S.C. 202) in which the Contractor has elected to retain title.

CROSS REFERENCE TO RELATED APPLICATION

The present application is a continuation-in-part application of Ser. No. 07/149,653, now U.S. Pat. No. 4,818,079, filed Jan. 28, 1988, which is a divisional application of Ser. No. 07/003,633, now abandoned, filed Jan. 15, 1987.

TECHNICAL FIELD

The present application relates to semiconductor modulators, and, in particular, to semiconductor modulators employing multiple quantum wells.

BACKGROUND ART

The formation of ultrathin layers of different semiconductor materials (heterostructures) on the order of 50 to 200 Å leads to the quantization of confined carriers. Such ultrathin heterostructures can form quantum well structures and be repeated into alternating layers forming multiple quantum wells and superlattices.

The energy band diagram for such structures evidences abrupt steps in the energy gap which form potential wells in the conduction and valence bands, as is well-known. Appropriate selection of materials, compositions and layer thicknesses permits fabrication of unique electro-optic devices.

The use of optics to perform signal processing is attractive because of the high speed of light and the opportunity of using many parallel channels, which yield the promise of very high throughput rates. However, a major obstacle to the realization of this goal has been the lack of a real-time, reliable, high performance spatial-light-modulator (SLM). This lack is largely due to the limitations of materials.

DISCLOSURE OF INVENTION

In accordance with the invention, multiple quantum well (MQW) structures are utilized to provide real-time, reliable, high performance, optically-addressed spatial-light-modulators (SLM). Such MQW structures comprise alternating layers of a first material (quantum well) material alternating with a second material (space charge barrier), the bandgap of the quantum well material being lower than that of the barrier material. Examples of suitable lower bandgap/higher bandgap materials systems include such III-V systems as InAs/GaAs, (In,Ga)As/GaAs, InAs/AlSb, (In,Ga)As/(Al,Ga)As, (In,Ga)As/InP, and (In,Ga)As/(In,Al)As.

The optically-addressed SLM comprises a vertical stack of MQW layers within the penetration depth of an optical write signal and with each quantum well separated by a space charge barrier (in the larger bandgap material) having predetermined tunneling relaxation times by control of doping and thickness, whereby modulation sensitivity is high and no external voltage source is required. An incident optical read signal may be modulated by an incident optical write signal.

In a preferred embodiment, an improved real-time, reliable, high-performance spatial-light modulator having interleaved space charge barriers formed by doped semiconductor layers for driving the multiple quantum wells photovoltaically, is characterized by the use of the shift caused by either the quantum confined Stark effect, possibly enhanced by strain effects, or by filling of two-dimensional states in the multiple quantum wells. The shift of absorption edge due to the filling of states is analogous to the well-known Moss-Burnstein shift in bulk materials but is much larger because of the carrier confinement and the low density of two-dimensional quantum well states.

In additional embodiments, p-n junctions or n-i-p-i structures may be employed to overcome smaller band offsets, in which the quantum wells are formed either between n-layers for the quantum state filling effect or in the intrinsic region for the quantum confined Stark effect.

Thus, the selection of appropriate materials, having the properties specified above, permit fabrication of high performance, optically-addressed SLMs.

BEST MODES FOR CARRYING OUT THE INVENTION

Recent advances in molecular-beam-epitaxy (MBE) have made possible the growth of new semiconductor microstructures such as multiple quantum wells (MQWs) and compositional superlattices. This has enabled the opportunity of engineering the material structure with specifically enhanced electro-optic properties.

In accordance with the invention, a novel real-time, high performance, optically-addressed SLM comprises a vertical stack of multiple quantum well layers within the penetration depth of an optical write signal, a plurality of space charge barriers having predetermined tunneling relaxation times by control of doping and thickness, whereby modulation sensitivity is high and no external electrical contacts or voltage source is required.

Figure 1:
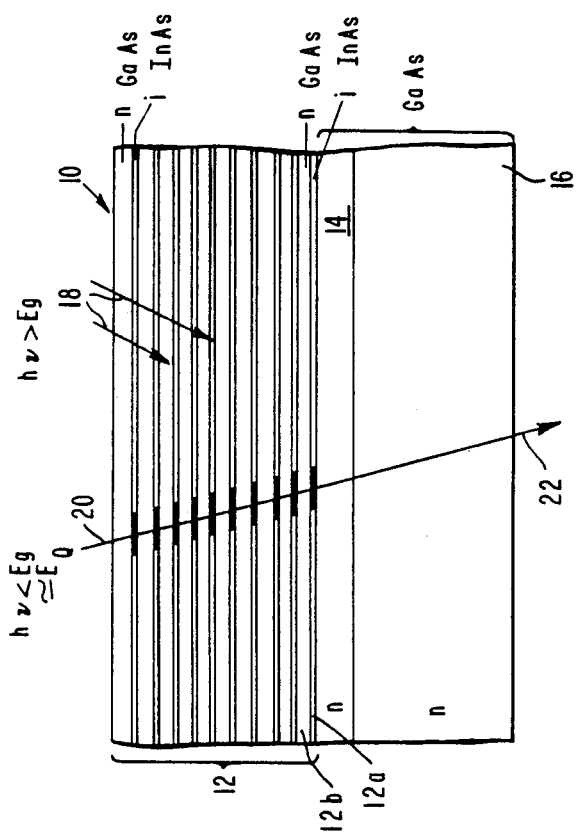
FIG. 1 is a cross-sectional view of a photovoltaic-driven multiple quantum well modulator in accordance with an embodiment of the invention.
Figure 3:
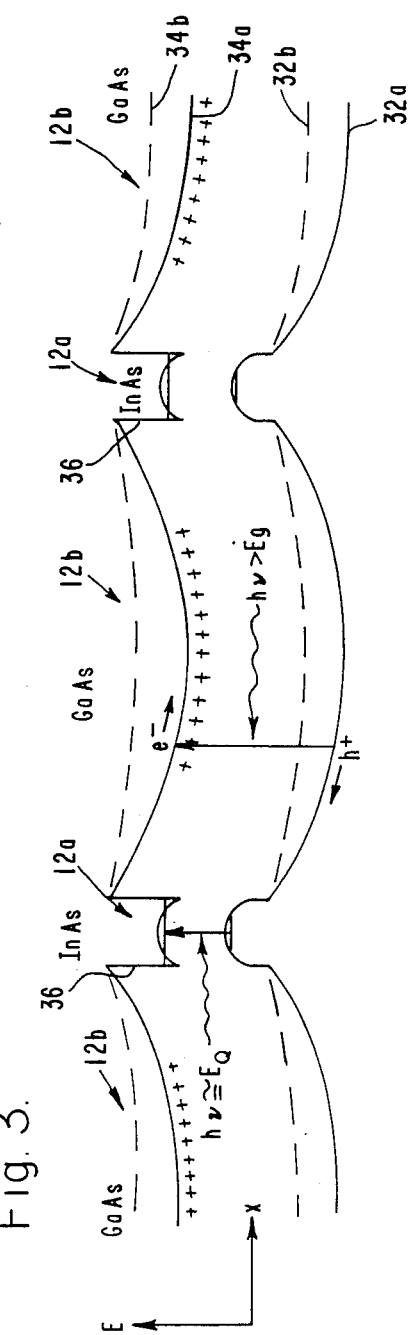
FIG. 3, on coordinates of length (x) and energy (E), is a plot depicting the energy diagram through five layers of the structure depicted in FIG. 1 and illustrating the quantum-confined Stark effect in conjunction with selective doping.
Figure 2:
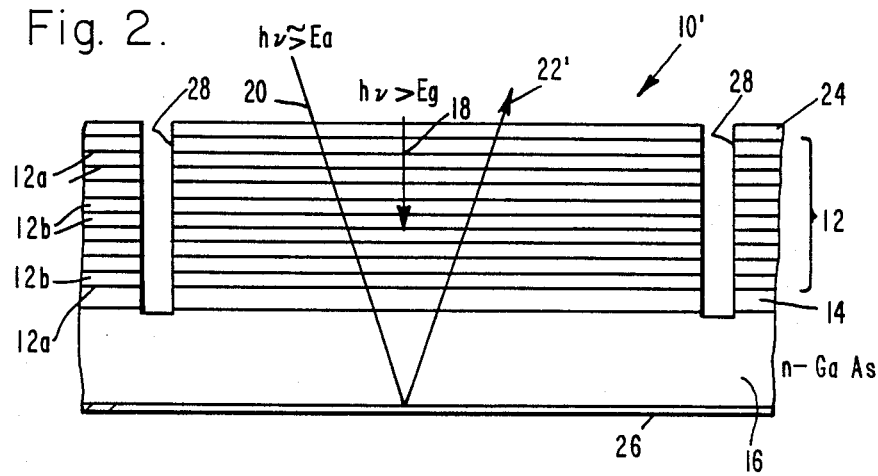
FIG. 2 is a view similar to that of FIG. 1, illustrating an alternate embodiment of the invention.

FIGS. 1 and 2 are cross-sectional views of the SLM of the invention, and FIG. 3 is an energy diagram of a portion of the structure shown in FIGS. 1 and 2.

Shown in FIG. 1 is a photovoltaic-driven MQW modulator 10 comprising a structure 12 of a plurality of alternating layers of two dissimilar semiconductor materials, one comprising the quantum well 12a and the other providing space charge barriers 12b. The quantum well material must have a significant conduction band offset relative to the adjacent material (such as shown in FIG. 3) so that the space charge barrier is effective and electron recombination is not too fast.

The MQW structure 12 is formed on a buffer layer 14 comprising n-GaAs, which in turn is formed on a GaAs substrate 16, doped with an n-type dopant (see FIGS. 1 and 2). The substrate doping should not be important, but some doping may be necessary to provide a ground plane or equipotential plane to drain off charge accumulation through the substrate and avoid hysteresis effects. The MQW structure 12 begins with an undoped InAs layer 12a on layer 14 and ends with an n-GaAs layer 12b.

The InAs/GaAs structure 12 permits a write signal 18 to be absorbed therein at photon energies greater than the GaAs bandgap $E_g$. A read signal 20 would be at energies below $E_g$, but close to the quantum level $E_Q$, and thus could be transmitted through the GaAs substrate 16, without requiring removal of the substrate by etching, to provide an output signal 22.

Figure 7:
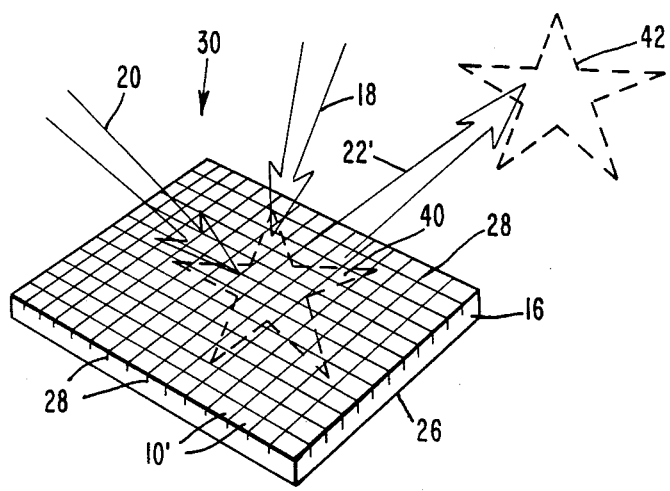
FIG. 7 is a perspective view of a large array spatial light modulator in accordance with the invention.

FIG. 2 shows another modulator 10', similar to that depicted in FIG. 1, and illustrates the addition of a transparent anti-reflective coating 24 over the multiple quantum well structure 12 on the front surface, a metal reflective layer 26 on the rear surface of the substrate 16, and etched grooves 28 used in forming an array 30, shown in FIG. 7. The preferred added anti-reflection coating 24 and reflective metal layer 26 at the back side of the wafer 16 would provide two passes of the read signal 20, and thus would double the modulation depth, providing a reflected modulated output signal 22'. Alternatively, the device could be made into an etalon structure, for multiple passes of the read signal, for further enhancement of the modulation depth.

In a particular embodiment (shown in FIG. 3), the structure 12 comprises alternating layers of undoped InAs (quantum well layer) 12a and selectively-doped n-GaAs (providing the space charge barrier) 12b. In this system, the quantum well material, InAs in this example, has a lower bandgap than the GaAs substrate material. This property provides for quantum well energies below the bandgap of the GaAs substrate, allowing light that can be modulated by the quantum wells to pass freely through the substrate. Examples of other lower bandgap/higher bandgap systems include (In,Ga)As/GaAs, InAs/AlSb, (In,Ga)As/(Al,Ga)As (In,Ga)As/InP, and (In,Ga)As/(In,Al)As. It should be noted that the use of the term "undoped" herein means unintentionally doped, since all semiconductor materials include impurities to some extent.

In this example, the undoped InAs layers 12a must be very thin, on the order of about 50 Å, to stay within the elastic limit of strain and minimize formation of misfit dislocations (defects). However, since the thickness of this layer 12a affects performance, a less strained system, such as (In,Ga)As/GaAs or InAs/AlSb, or an unstrained system, such as (In,Ga)As/InP, might be better alternative materials systems. Such other III-V materials, not so strained, will permit fabrication of layers greater than about 100 Å in thickness, which are preferred for this embodiment which utilizes the quantum confined Stark effect. On the other hand, it may also be desirable to take advantage of strain (within the elastic limit), since it is predicted to create enhanced electro-optical properties with (111) orientation.

The alternating n-GaAs layers 12b are thicker, on the order of about 300 to 500 Å. The sheet doping $N_s$ is on the order of about 1 to $4 \times 10^{12}$ cm$^{-2}$. The n-doping should not be so large as to fill the states in the quantum well (with electrons) to the next quantum level. The doping need only be sufficient to satisfy the requirement of the space charge barrier; that is, by Gauss' law, the minimum dopant sheet density $N_s$ is given by $$N_s \gtrsim (\epsilon/e^2)(\Delta E_c/d)$$

where $\epsilon$ is the semiconductor permittivity, e is the electron charge, $\Delta E_c$ is the conduction band offset, and d is the barrier thickness.

Preferably, a selectively-doped profile is employed across the thickness of each layer 12b, most preferably undoped at the boundaries and doped in the center thereof. If such selective doping is employed, the extent of doping may in the limit be on the order of about $10^{19}$ cm$^{-3}$ over some 10 Å, giving $N_s$ on the order of $10^{12}$ cm$^{-2}$, according to a recently developed technique of MBE referred to as delta doping. In this case, the thickness of the layer 12b may be reduced to about 200 to 300 Å. Such a decrease in thickness for layers 12b permits stacking of more alternating layers 12a, 12b, which results in a desirable increase in the number of active (absorbing) quantum wells provided by layer 12a. It should be noted that the stacking of the MQWs 12a should be within the penetration depth of the optical write signal 18 of about 1 to 2 $\mu$m.

Layer 14 is about 1,000 Å thick, which includes a buffer layer to the substrate, and is selectively doped adjacent the first InAs layer 12a to the same extent as the n-layers 12b. The underlying substrate region may be uniformly n-doped, for example, anywhere in the range of about $10^{15}$ to $10^{18}$ cm$^{-3}$.

A p-doped substrate 16, p-doped buffer layer 14 and p-doped layers 12b may alternatively be employed, especially of the offset of the valence bands is larger than that of the conduction bands, such as is the case for the material system (In,Ga)As/InP.

The electron-hole pairs generated by the write signal 18 are separated by the built-in space charge field. As indicated in FIG. 3, this charge separation changes the barrier profiles from 32a and 34a (in the absence of light) to 32b and 34b (with light on). This photovoltaic effect produces a very large field change at the boundaries of the quantum wells 12a, which leads to large shifts of the absorption edge energy $E_Q$ by the quantum confined Stark effect. As the write signal 18 shifts the absorption edge $E_Q$ through the photon energy of the read signal 20, it produces the modulated output signal 22.

The symmetric form of the field at the quantum well boundaries 36 requires larger fields and quantum well thicknesses to produce the same shift as in the case of the more usual unidirectional fields. However, much higher fields (well in excess of $10^5$ V/cm) may be easily employed, since the fields are internally generated and thus no avalanche breakdown is possible.

The integration/relaxation time of the system is determined at lower operating temperatures by tunneling through the n-doped space charge barriers 34, which can be predetermined by choice of doping distribution and layer thickness. For example, at a given layer 12b thickness, the barrier tunneling time can be increased (to achieve longer integration times) by concentrating the dopant near the middle of the layers, in the preferred doping profile described above.

Figure 4:
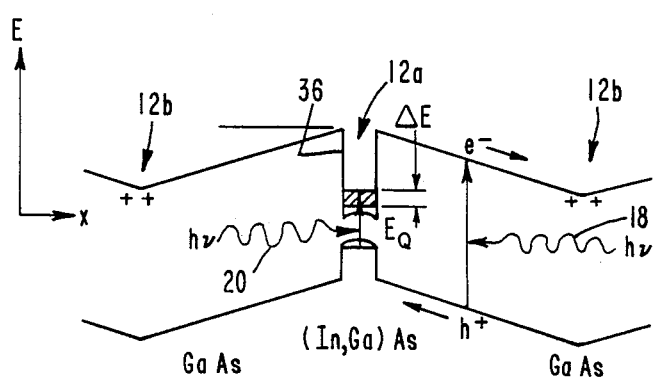
FIG. 4 is a plot similar to that of FIG. 3, but depicting the energy diagram resulting from use of quantum state filling in conjunction with delta doping.

A major advantage of using the quantum confined Stark effect in the embodiment described above is when strain enhancement effects are to be utilized. In another embodiment, when strain is not utilized, the sensitivity of the device described above can be increased by employing the shift due to the filling of two-dimensional states in the quantum wells, as shown in FIG. 4. This approach is termed the "quantum state filling effect". In this case, quantum well materials are preferred which have low effective mass ($m^* = 0.023 \times$ free electron mass), such as InAs. Thinner quantum wells, about 50 Å, may be used, which are within the elastic limit of InAs/GaAs.

The low effective mass of InAs, $m^*$, gives a low density of two-dimensional (2D) electron states, and a corresponding large shift in the absorption edge $E_Q$ given by:

$$\Delta E = (\pi \hbar^2 / m^*) n_s,$$

where $\hbar$ is Planck's constant divided by $2\pi$ and $n_s$ is the electron density per unit area of occupied 2D states. The density $n_s$ is related to the field, $F_s$, at the boundaries of the quantum well through Gauss' law, by $$F_s = e n_s / \epsilon.$$

As described above, the photovoltaic effect from the write signal produces a decrease of $F_s$ and thus from above an equivalent decrease of $n_s$, leading to a corresponding decrease in V and shift in $E_Q$.

The interleaved n-doped GaAs layers 12b provide both the electrons in the quantum wells and the space charge barriers which separate hole-electron pairs generated by an optical write signal with $h\nu > E_g$ (GaAs). The photogenerated holes drift to the quantum wells 12a and recombine there with electrons in the wells, depleting their density $n_s$ by an amount $\Delta n_s$, depending on the photon flux. Again, the decrease in occupied levels $\Delta E$ shifts the quantum well absorption edge $E_Q$. As indicated above for the structures depicted in FIGS. 1 and 2, the read signal 20, with photon energy just below the initial absorption edge, is modulated by the shift. The shift using InAs MQWs is expected to be about ten times larger than that using the quantum-confined-Stark effect in, for example, (Al,Ga)As/GaAs MQW structures driven by the same field (or equivalent charge).

It is noted that FIG. 3 utilizes distributed doping of the space charge barriers 12b, while FIG. 4 utilizes delta doping of the space charge barriers. The doping profile is not peculiar to either effect; however, the delta doping profile is preferably employed in either effect. Also, the dopant sheet density $N_s$ is specified similarly for both effects.

Both of the foregoing effects require a conduction (or valance) band offset between the two materials of about 0.5 eV or more. This value is not easy to achieve with most common III-V materials, although it is greatly exceeded with the InAs/AlSb system (1.0 eV). To use materials systems with smaller conduction (or valance) band offsets, n-p junctions or "n-i-p-i" structures may be utilized.

Figure 5:
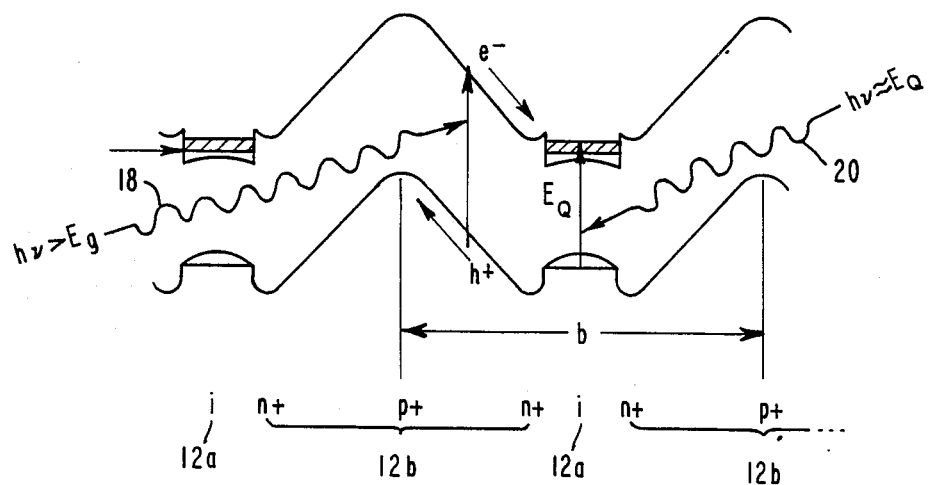
FIG. 5 is a plot similar to FIGS. 3 and 4, depicting yet another embodiment of the invention, employing p-n junctions to overcome smaller band offsets used in conjunction with quantum wells and quantum state filling.

FIG. 5 shows an energy diagram of an element of the embodiment employing p-n junctions in combination with quantum wells, which uses the quantum state filling effect. As above, the write signal with photon energy greater than the GaAs bandgap generates electron-hole pairs which are separated by the internal field produced, in this case, by the p-n junctions (photovoltaic effect). The photoelectrons fill the quantum states by an amount E, causing a shift in the absorption edge which modulates the read signal in the range of this shift. The p-n junction in FIG. 5 is seen to increase the total barrier separating the electrons and holes compared with the space charge barrier of FIG. 4, and thus increase the recombination time sufficiently for sensitive operation at room temperature. This structure is incorporated into the same overall modulator embodiment shown in FIGS. 1 and 2 with the additional p-GaAs layer.

Figure 6:
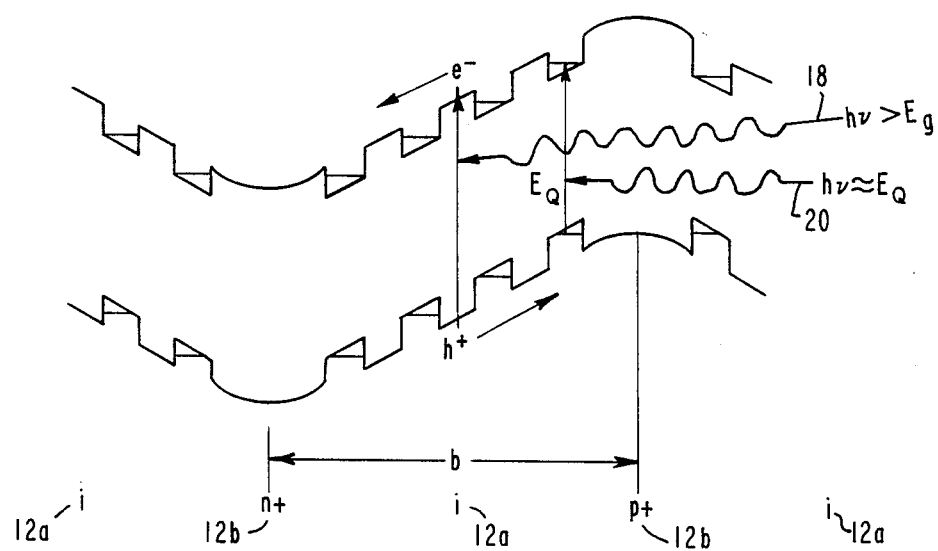
FIG. 6 is a plot similar to FIGS. 3-5 depicting another embodiment employing n-i-p-i structures to overcome smaller band offsets, used in conjunction with MQWs and quantum confined Stark effect.

FIG. 6 shows an energy diagram of an element of the embodiment which combines n-i-p-i structures with MQWs. In this case, the MQWs are placed in the uniform field of the intrinsic (i) region of the n-i-p-i structures and make use of the quantum confined Stark effect. In contrast to FIG. 3, this embodiment uses a unidirectional field. As in that case, the field is reduced by the photovoltaic effect of the write signal which causes the quantum confined Stark shift of the absorption edge, which in turn modulates the read signal. Again, the barrier produced by the n-i-p-i structure in FIG. 6 is much larger than the space charge barrier of FIG. 3, increasing the recombination time and sensitivity. However, this increase in recombination time and sensitivity also slows the response time, so that the optimum choice in barrier design will depend on the application. This is the well-known constant gain bandwidth product. As in the above cases, this structure is incorporated into the embodiments of FIGS. 1 and 2.

A large array spatial light modulator 30 could be fabricated straight-forwardly merely by etching sets of grooves 28 in a grid pattern, to separate pixels 10' of desired size, for example, into 10 m square, as illustrated in FIG. 7. An image 40 written in the MQW structure 12 by the write signal 18 is generated to form an output image 42 by modulation of the read signal 20 by the write signal 18, which produces the reflected signal 22' carrying the output image.

INDUSTRIAL APPLICABILITY

The various embodiments of the optically-addressed spatial-light-modulators described herein will find use in a variety of optical information processing applications.

Thus, optically-addressed spatial-light-modulators have been disclosed in a III-V semiconductor material which employ multiple quantum wells comprising alternating layers of a lower bandgap material (quantum well) and a higher bandgap material (space charge barrier). It will be apparent to one of ordinary skill in the art that various changes and modifications may be made without departing from the spirit and scope of the invention, and all such changes and modifications are intended to fall within the scope of the invention, as defined by the appended claims.

What is claimed is:

1. An internally photovoltaically driven optical modulator comprising a multiple quantum well structure formed on a substrate layer of a first material, said multiple quantum well structure comprising a plurality of alternating layers of said first material and a second material, said first material having a bandgap greater than that of said second material, said layers of said first material each comprising a doped semiconductor provided with a selectively-doped profile across the thickness of each layer thereof and forming a plurality of space charge barriers having predetermined tunneling times by control of doping and thickness thereof and said second material comprising an undoped semiconductor.

2. The optical modulator of claim 1 wherein said selectively-doped profile comprises doping in the center of each said layer and non-doping near the boundaries between said layer of said first material and said layer of said second material.

3. The optical modulator of claim 1 wherein said layers of said first material each constitute a space charge barrier comprising a layer of gallium arsenide and said layers of said second material each constitute a quantum well structure comprising layers of indium arsenide.

4. The optical modulator of claim 3 wherein said space charge barrier layers comprise n-GaAs about 200 to 500 Å thick and said quantum well layers comprise undoped InAs about 50 Å thick.

5. The optical modulator of claim 1 wherein said space charge barrier and said quantum well layers comprise combinations selected from the group consisting of gallium arsenide/indium arsenide, gallium arsenide/indium gallium arsenide alloy, aluminum antimonide/indium arsenide, aluminum gallium arsenide alloy/indium gallium arsenide alloy, indium phosphide/indium gallium arsenide alloy, and indium aluminum arsenide alloy/indium gallium arsenide alloy.

6. The optical modulator of claim 1 further provided with a reflective metal coating on said substrate layer opposite said multiple quantum well structure and further provided with an anti-reflective coating over said multiple quantum well structure.

7. The optical modulator of claim 1 wherein p-n junctions are formed within each space charge barrier layer.

8. The optical modulator of claim 7 wherein each space charge barrier layer comprises a triad of n-p-n layers, with each space charge barrier layer separated by said undoped (intrinsic) quantum well layer.

9. The optical modulator of claim 1 wherein each space charge layer is alternately doped n and p so as to form an n-i-p-i structure in conjunction with said undoped (intrinsic) quantum well layers.

10. An array of spatial light modulators comprising a plurality of internally photovoltaically driven optical modulators, separated from each other but sharing a common substrate, said optical modulators comprising a multiple quantum well structure formed on a substrate layer of a first material, said multiple quantum well structure comprising a plurality of alternating layers of said first material and a second material, said first material having a bandgap greater than that of said second material, said layers of said first material each comprising a doped semiconductor provided with a selectively-doped profile across the thickness of each layer thereof and forming a plurality of space charge barriers having predetermined tunneling times by control of doping and thickness thereof and said second material comprising an undoped semiconductor.

11. The array of claim 3 wherein said selectively-doped profile comprises doping in the center of each said layer and non-doping near the boundaries between said layer of said first material and said layer of said second material.

12. The array of claim 10 wherein said layers of said first material each constitute a space charge barrier comprising a layer of gallium arsenide and said layers of said second material each constitute a quantum well structure comprising layers of indium arsenide.

13. The array of claim 12 wherein said space charge barrier layers comprise n-GaAs about 200 to 500 Å thick and said quantum well layers comprise undoped InAs about 50 Å thick.

14. The array of claim 10 wherein said space charge barrier and said quantum well layers comprise combinations selected from the group consisting of gallium arsenide/indium arsenide, gallium arsenide/indium gallium arsenide alloy, aluminum antimonide/indium arsenide, aluminum gallium arsenide alloy/indium gallium arsenide alloy, indium phosphide/indium gallium arsenide alloy, and indium aluminum arsenide alloy/indium gallium arsenide alloy.

15. The array of claim 10 further provided with a reflective metal coating on said substrate layer opposite said multiple quantum well structure and further provided with an anti-reflective coating over said multiple quantum well structure.

16. The array of claim 10 wherein p-n junctions are formed within each space charge barrier layer.

17. The array of claim 16 wherein each space charge barrier layer comprises a triad of n-p-n layers, with each space charge barrier layer separated by said undoped (intrinsic) quantum well layer.

18. The array of claim 10 wherein each space charge layer is alternately doped n and p so as to form an n-i-p-i structure in conjunction with said undoped (intrinsic) quantum well layers.

* * * * *